United States Patent
Koss et al.

(10) Patent No.: US 7,055,075 B2
(45) Date of Patent: May 30, 2006

(54) APPARATUS FOR RANDOM ACCESS MEMORY ARRAY SELF-TEST

(75) Inventors: Louise A. Koss, Ft. Colllins, CO (US); Mary Louise Nash, Fort Collins, CO (US); Dale Beucler, Ft Collins, CO (US)

(73) Assignee: Avago Techologies General IP Pte. Ltd., Singapore (SG)

( * ) Notice: Subject to any disclaimer, the term of this patent is extended or adjusted under 35 U.S.C. 154(b) by 485 days.

(21) Appl. No.: 10/008,382

(22) Filed: Dec. 5, 2001

(65) Prior Publication Data

US 2003/0105999 A1 Jun. 5, 2003

(51) Int. Cl.
*G11C 29/00* (2006.01)

(52) U.S. Cl. ..................................... 714/718
(58) Field of Classification Search ................ 714/718, 714/719, 733, 711, 7, 710; 365/200, 201; 324/765
See application file for complete search history.

(56) References Cited

U.S. PATENT DOCUMENTS 5,301,156 A * 4/1994 Talley ........................ 365/201
6,408,401 B1 * 6/2002 Bhavsar et al. ................ 714/7
6,609,222 B1 * 8/2003 Gupta et al. ................ 714/733

OTHER PUBLICATIONS

U.S. Appl. No. 10/679,928, filed Oct. 6, 2003, Koss et al.
U.S. Appl. No. 10/021,614, filed Dec. 5, 2001, Koss et al.

* cited by examiner

*Primary Examiner*—Albert Decady
*Assistant Examiner*—James C. Kerveros

(57) ABSTRACT

An apparatus for the on-chip testing of random access memory arrays. In representative embodiments, embedded circuitry provides the ability to test random access memory arrays on-chip without requiring substantial area on the chip. The circuits are inherently located closer to the tested area which reduces propagation delay errors. These advantages have been obtained by locating the circuitry necessary to perform such test in the addressing and input/output blocks of the RAM.

15 Claims, 6 Drawing Sheets

APPARATUS FOR RANDOM ACCESS MEMORY ARRAY SELF-TEST

FIELD OF THE INVENTION

The present invention relates generally to random access memories (RAM) in integrated circuits and, more particularly, to the test of such circuits and, even more particularly, to their test on-chip.

BACKGROUND OF THE INVENTION

Motivated by the desire for both lower cost and higher performance, integrated circuit (IC) technology has moved throughout its history toward building larger and larger circuits comprising more and more devices. The development of random access memory (RAM) integrated circuits have shared in this movement. In the sense of containing a larger number of memory cells where each cell can store one bit, the larger a RAM becomes, the more difficult and expensive it is to test it. Also, the more expensive the cost of a defect in the circuit, as a single defect can result in the loss of the whole chip.

Not only are RAM's fabricated as stand-alone chips, but they are also built embedded as function blocks in other integrated circuits. Such integrated circuits could be designed and produced as standard chips intended for a variety of applications and as application specific integrated circuits (ASIC's).

With the size and complexity of modern integrated circuits including RAM's, testing has become an important issue. Size and cost constraints limit the area on the integrated circuit available for use as wire bonding pads, flip-chip solder bumps, and the like with the resultant effect of limiting access to the various functioning areas of the chip. So, not all functions of the chip are externally available for direct test. Even if connections to some of these areas were available, the long traces and additional external circuitry necessary to access them would introduce signal delays that could render the results of such testing questionable. Thus of necessity, some testing circuitry is now often included on-chip.

On-chip testing also has its share of difficulties as chip area available for testing is limited, as is accessibility to nodes for testing. Delays introduced by trace lengths also continue to be an issue. In addition unless the chip is designed for mass production, the costs associated with design, manufacturing, and test can be prohibitive.

Additional, redundant circuitry is often included in large integrated circuits. Techniques available, as for example laser fusing, permit the removal of defective parts of the IC and its replacement with the redundant part. This process is cost effective, since on average the added cost of the redundant circuitry is less than the cost associated with the yield loss without the additional circuitry. The addition of redundant circuitry is especially valuable for circuits with repeating structure function blocks, such as RAM and other types of memory. In such circuits a limited number of defective cells can be replaced with the redundant cells embedded in the circuitry. Once again, however, unless the chip is designed for mass production, design costs can be prohibitive.

Thus since current on-chip techniques for testing RAM function blocks typically require a substantial area on the chip and are typically somewhat removed from the tested area introducing propagation delay errors, there is a need for enhanced means for testing RAM circuits on-chip.

SUMMARY OF THE INVENTION

In one representative embodiment, an electronic circuit for self-test of a random access memory array is disclosed wherein the random access array has a plurality of memory storage cells, wherein the storage cells are organized into a plurality of slice arrays. The electronic circuit includes a control circuit, an address selection circuit, an input/output circuit associated with each slice array, and an error detection circuit. The control circuit directs the address selection circuit to index through memory addresses. The control circuit also directs each input/output circuit to write data into its associated slice array at the indexed memory address, to read data from the associated slice array at the indexed memory address, and to compare the data read from the associated slice array with that written into the associated slice array at the indexed memory address. The error detection circuit collects results of the self-test data comparisons from each input/output circuit and notifies the control circuit of the results of the self-test.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements.

DETAILED DESCRIPTION OF THE PREFERRED EMBODIMENTS

Figure 1:
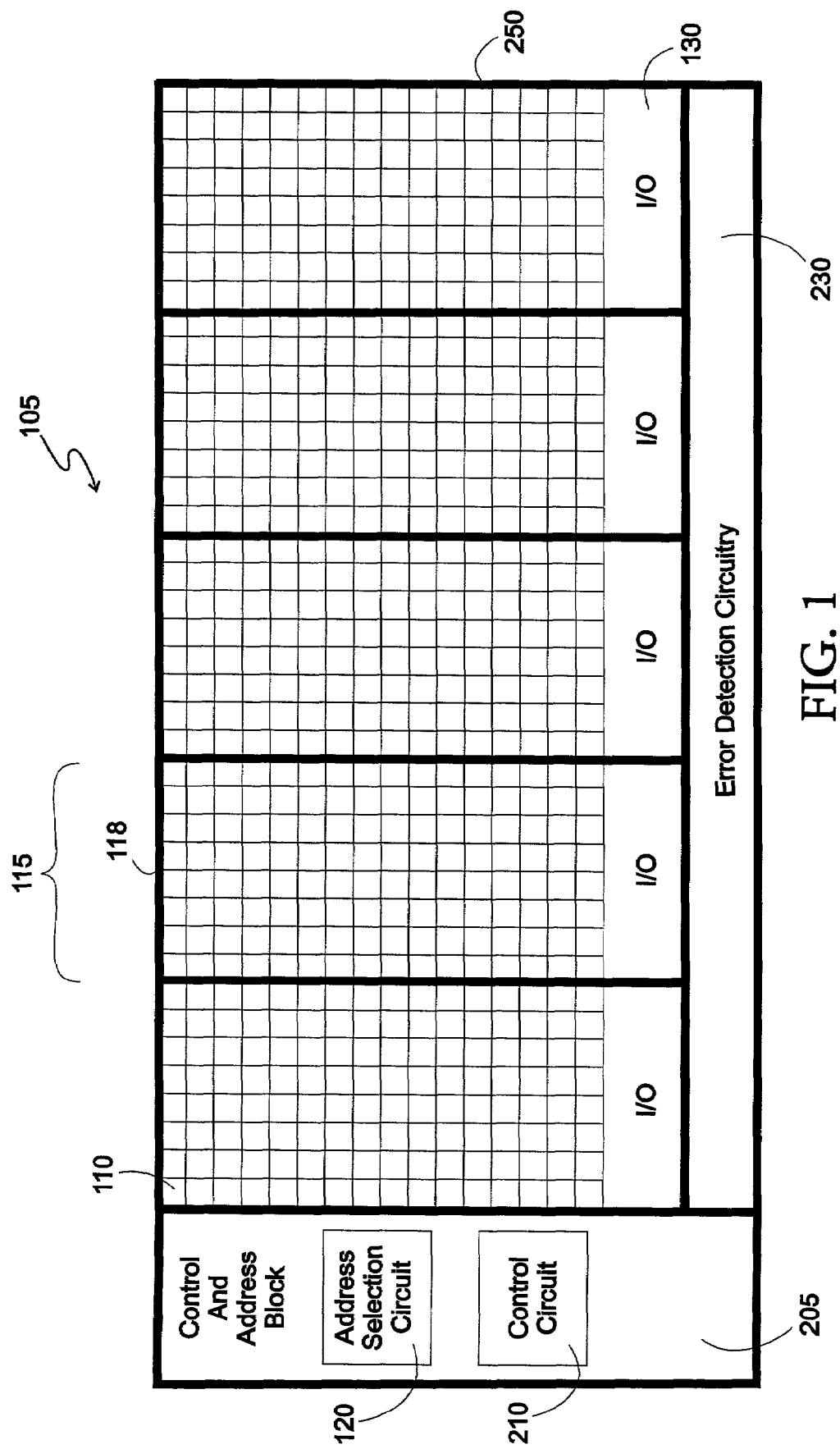
FIG. 1 is a diagram of the architecture of a RAM circuit as described in various representative embodiments consistent with the teachings of the invention.

As shown in the drawings for purposes of illustration, the present patent document relates to novel apparatus for the automatic testing of RAM circuits on-chip. Previous circuitry for on-chip testing have required substantial area on the integrated circuit (IC) chip and have been somewhat removed from the tested area introducing propagation delay errors. By locating the circuitry necessary to perform such test in the addressing and input/output blocks of the RAM, these problems have been reduced.

Also, as shown in the drawings for purposes of illustration, the present patent document relates to novel apparatus for the repair of defective RAM circuits. Previous methods for repair of RAM circuits have typically used techniques such as laser repair which permit the removal of defective parts of the integrated circuit chip and then replacement with a redundant part. However, this process is expensive as an additional processing step is involved. By including the circuitry necessary to repair defects in RAM circuits in the input/output blocks of the RAM, this problem has been negated.

In the following detailed description and in the several figures of the drawings, like elements are identified with like reference numerals.

1. RAM Architecture:

FIG. 1 is a diagram of the architecture of a RAM circuit 105 as described in various representative embodiments consistent with the teachings of the invention. In FIG. 1, memory storage cells 110, also referred to herein as storage cells 110 and more concisely as cells 110, are indicated by small squares. For ease of illustration, only one storage cell 110 is labeled in FIG. 1.

A representative example RAM memory, which is not that shown in FIG. 1, could comprise logically 416 words with 50 bits of data in each word. Using bit-slice architecture for such an example, a slice of cells is created in which each slice represents one bit of data but it is 416 words. During the design phase, a slice is created that is 416 bits high by one bit wide. This slice is then duplicated 50 times to create the complete array. This methodology creates a very tall and fairly narrow array for this example.

By designing the RAM array wherein bits occupying an identical ordinal positional in nearby words are moved to adjacent horizontal positions, a better aspect ratio for the array can be obtained. In the example of FIG. 1, each bit-slice 115 contains eight cells 110 in width instead of one. The array now is only 52 words tall with each word still 50 bits wide. Words now, however, are interleaved on the same row. The aspect ratio of the storage array has become more square in the process resulting in a more compact design. A more compact design is preferable as designs that have long traces running vertically between cells could prevent the RAM from functioning properly at the speeds needed.

The RAM circuit 105 of FIG. 1 includes a RAM array 250, also referred to herein as a random access memory array 250, for storing data. The RAM array 250 is divided into sections referred to herein as slice arrays 118 wherein each slice array 118 includes an associated group of memory storage cells 110

Also shown in FIG. 1, each bit-slice 115 includes an I/O circuit 130, as well as the associated slice array 118. A control and address block 205 comprises a control circuit 210 and an address selection circuit 120. The control circuit 210 controls test initiation and progress. The address selection circuit 120 enables the selection of memory storage cells 110 for reading and writing of data. In addition, FIG. 1 shows error detection circuit 230 which has inputs from the I/O circuits 130 and outputs information regarding any errors found during the test to the control circuit 210.

Figure 2:
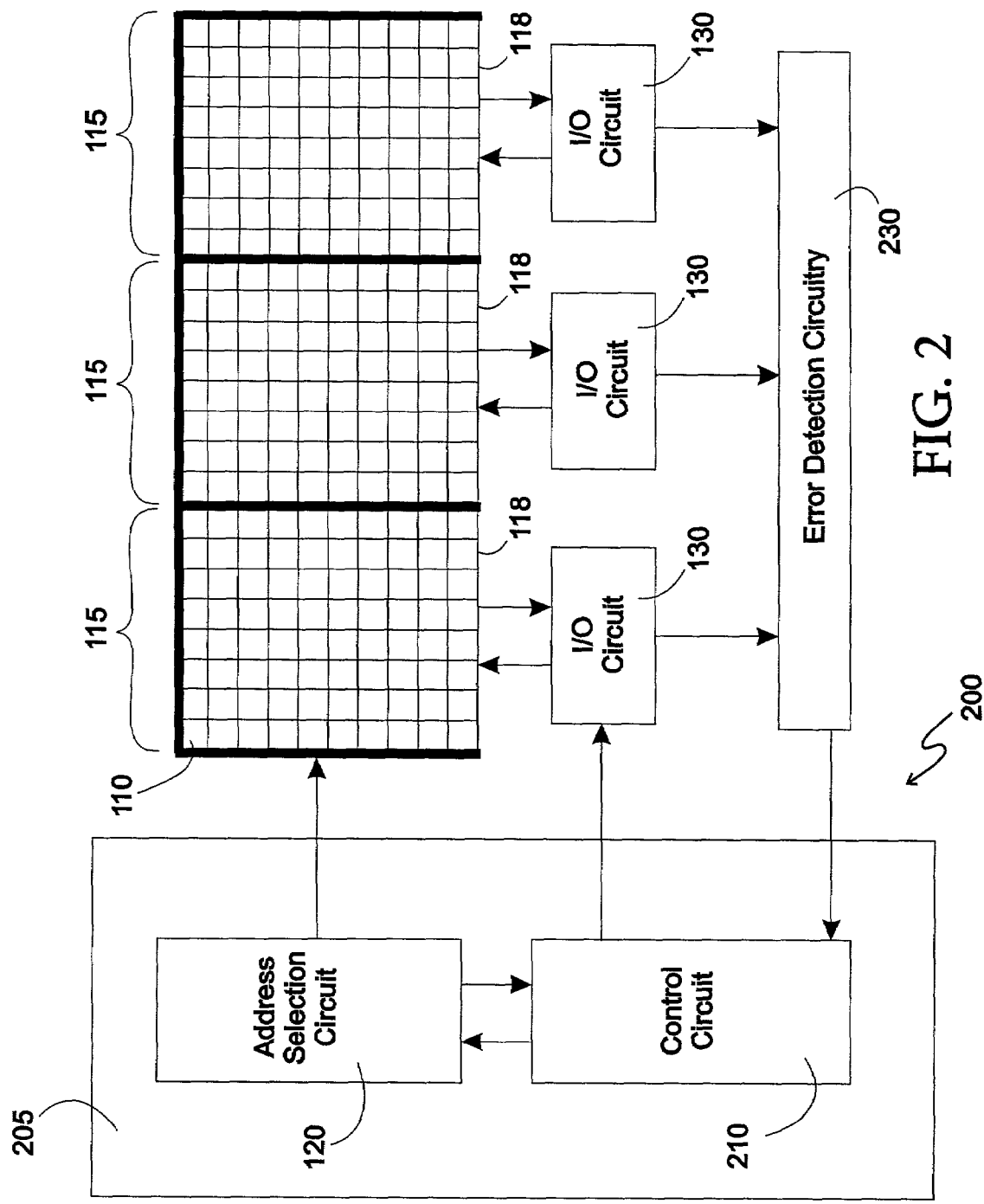
FIG. 2 is a block diagram of an electronic test circuit as described in various representative embodiments consistent with the teachings of the invention.

2. Overview of Self Test Circuitry:

FIG. 2 is a block diagram of an electronic test circuit 200 as described in various representative embodiments consistent with the teachings of the invention. The electronic test circuit 200 is also referred to herein as electronic circuit 200. The electronic test circuit 200 can be built into the address and I/O circuitry of the RAM circuit 105 and can be programmed to test every cell 110 of the RAM array 250 at wafer test, package test, power-up, as well as other times. The electronic test circuit 200 includes the control circuit 210 which controls the flow of the built-in test and the address selection circuit 120 described above. Data is written into and read out of the bit-slices 115 through the I/O circuit 130 of each bit-slice 115. The results of comparing the data written into the bit-slice 115 and that read out of it is reported to the error detection circuit 230 which reports those results back to the control circuit 210.

Figure 3:
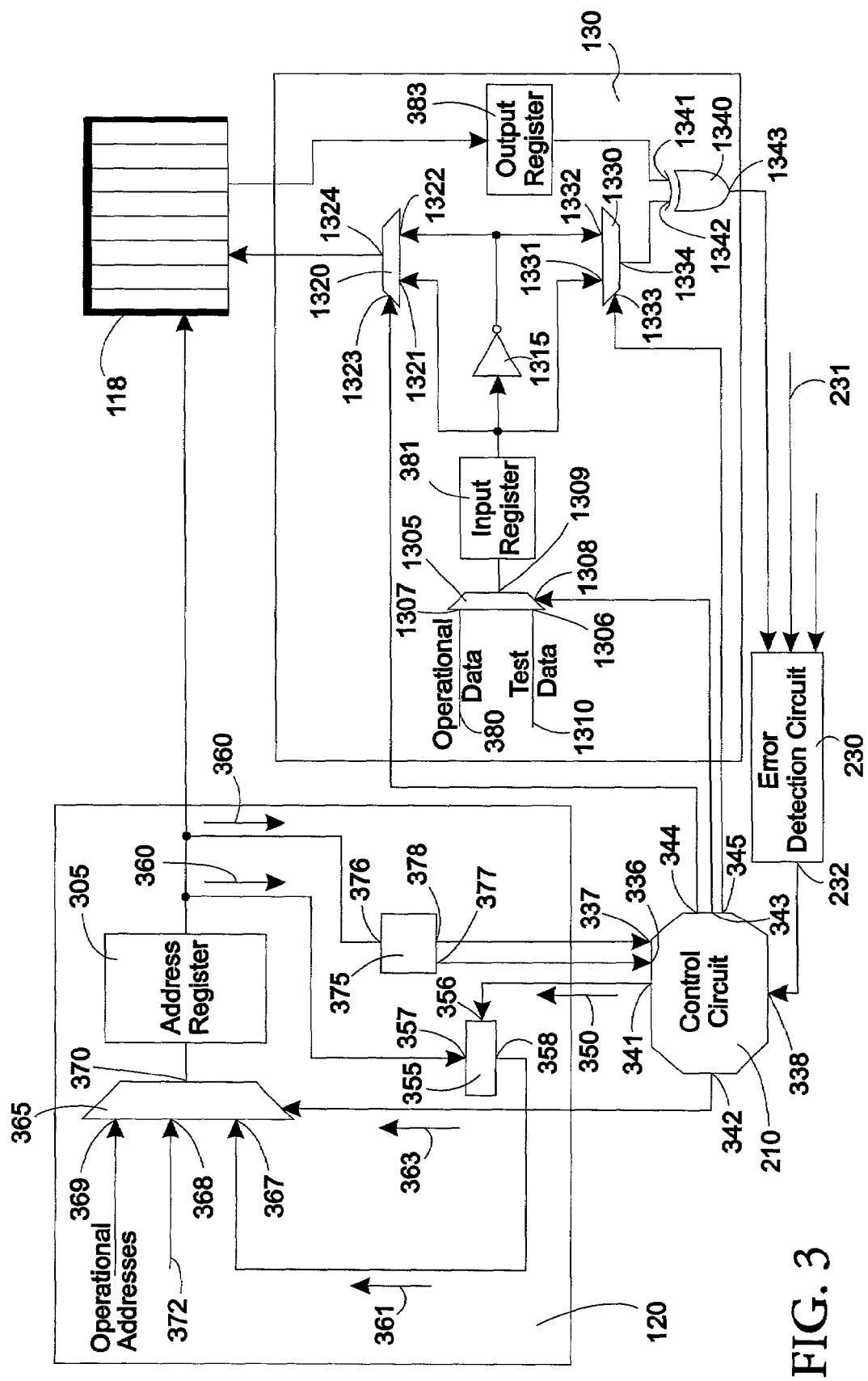
FIG. 3 is another block diagram of the electronic test circuit as described in various representative embodiments consistent with the teachings of the invention.

FIG. 3 is another block diagram of the electronic test circuit 200 as described in various representative embodiments consistent with the teachings of the invention. In FIG. 3, the various components of the test circuit 200 have been interconnected with other circuits normally present in RAM circuits 105.

3. Detail of Self Test Circuitry—Control Circuit:

The control circuit 210 controls the execution of the test that is performed on the RAM array 250. As shown in FIG. 3, the control circuit 210, has first, second, and third control-circuit inputs 336,337,338 and first, second, third, fourth, and fifth control-circuit outputs 341,342,343,344,345. While shown as a single line, some of these interconnection may, in fact, be multiple wires.

There are a variety of industry standard tests some of which are referred to as March tests that can be employed to test the RAM array 250. The March Tests writes preselected patterns in a preselected order into the RAM array 250 and then reads them back out to verify the integrity of the memory storage cells 110. Different March tests perform their tests in a variety of ways such as whether the test sweeps up or down thru the address space of the RAM array 250 and the number of times that the test is repeated. The test or tests performed, however, could be other than a March test. Regardless of the test performed, it is the control circuit 210 that controls the test.

As the control circuit 210 interacts with the other elements performing the test, various functions and aspects of the control circuit 210 will be discussed in connection with those other elements.

4. Detail of Self Test Circuitry—Test Address Selection Circuit:

The address selection circuit 120 comprises a sequencer 355, an address multiplexer 365, a RAM address register 305, and a comparator 375.

The control circuit 210 sends a first command 350 to the sequencer 355 at a sequencer control input 356 of the sequencer 355. The sequencer 355 also has sequencer data input 357 and a sequencer output 358. The sequencer 355 increments or decrements a memory address 360, wherein the memory address 360 is the memory address of the cell 110 selected for test and stored in the RAM address register 305. The result of the incrementation/decrementation, i.e., the output value of the sequencer 355, is referred to as an indexed memory address 361. Incrementation and decrementation can occur in random or in a preselected pattern, the simplest being to increment or decrement by a single address space. The sequencer control input 356 receives various commands from the first control-circuit output 341 of the control circuit 210. One of these commands is a command to increment. When the increment command is received, the sequencer 355 increments the memory address 360. Another of these commands is a command to decrement. When the decrement command is received, the sequencer 355 decrements the memory address 360.

The second control-circuit output 342 transmits a second command 363 which is received by the address multiplexer 365 on an address-multiplexer control input 366. The address multiplexer 365 also has first, second and third address-multiplexer data inputs 367,368,369 and an address-multiplexer output 370. The first address-multiplexer data input 367 receives the incremented/decremented memory address 360 from the sequencer output 358. The second address-multiplexer data input 368 receives an initial self-test memory address 372, wherein the initial self-test memory address 372 is the memory address 360 of the first cell 110 selected for test. The third address-multiplexer data input 369 receives RAM memory storage cell 110 addresses during normal operation of the RAM circuit 105.

When the second command 363 instructs the address multiplexer 365 to select the first address-multiplexer data input 367 as its active input, the address multiplexer 365 transfers contents of the first address-multiplexer data input 367 to the address-multiplexer output 370. When the second command 363 instructs the address multiplexer 365 to select the second address-multiplexer data input 368 as its active input, the address multiplexer 365 transfers contents of the second address-multiplexer data input 368 to the address-multiplexer output 370. And, when the second command 363 instructs the address multiplexer 365 to select the third address-multiplexer data input 369 as its active input, the address multiplexer 365 transfers contents of the third address-multiplexer data input 369 to the address-multiplexer output 370. The address-multiplexer output 370 transfers its contents to the RAM address register 305.

The comparator 375 receives the contents of the RAM address register 305 on a first comparator input 376. The comparator 375 also has a first comparator output 377 and a second comparator output 378. The comparator 375 compares the contents of the RAM address register 305 to the initial self-test memory address 372 and to a final self-test memory address 379. Final self-test memory address 379 is not shown on any of the drawings. For comparison purposes, both the initial self-test memory address 372 and the final self-test memory address 379 could be, for example, hard wired into the comparator 375, obtained from the control circuit 210, or obtained by other means. When the contents of the RAM address register 305 is the same as the initial self-test memory address 372, the first comparator output 377 is set to indicate that the contents of the RAM address register 305 is the same as the initial self-test memory address 372, i.e., at the beginning of the test. When the contents of the RAM address register 305 is the same as the final self-test memory address 379, the second comparator output 378 is set to indicate that the contents of the RAM address register 305 is the same as the final self-test memory address 379, i.e., the end of test has been reached.

The first control-circuit input 336 receives the contents of the first comparator output 377. When the first comparator output 377 indicates that the contents of the RAM address register 305 is the same as the initial self-test memory address 372, the control circuit 210 is so informed at first control-circuit input 336. When the second comparator output 378 indicates that the contents of the RAM address register 305 is the same as the final self-test memory address 379, the control circuit 210 is so informed at second control-circuit input 337. The control circuit 210 may sweep through various test sequences and may repeat those test sequences in various orders before it terminates the test.

An important characteristic of the control circuit 210 is that it is independent of the size of the RAM. It has no knowledge or dependence on the size of RAM addressing. It uses the initial self-test memory address 372 comparison result as reported at the first comparator output 377 and the final self-test memory address 379 comparison result as reported at the second comparator output 378 to tell it where to start and where to stop testing. As a result, once designed the control circuit 210 can be used again and again for different RAM blocks on different integrated circuit chips.

5. Detail of Self Test Circuitry—I/O Circuit:

Again in FIG. 3, various components of the test circuit 200 have been interconnected with other circuits normally present in RAM circuits 105. During normal operation, operational data 380 is inputted into input register 381 and is written into the slice array 118. Data is retrieved from the slice array 118 and written into output register 383.

The I/O circuit 130 comprises components common to the bit-slice 115, the input register 381 and the output register 383, as well as a data-in multiplexer 1305, an inverter 1315, an input-complement multiplexer 1320, an output-complement multiplexer 1330, and an exclusive-OR gate 1340. All components are present in the I/O circuit 130 regardless of whether tests are being performed or normal data operations are progressing. The data is merely routed according to the operating mode. An input path from the input-complement multiplexer 1320 to the slice array 118 and an output path from the slice array 118 to the output register 383 are shown in FIG. 3. However, in other embodiments both paths could time share the same transmission path.

The data-in multiplexer 1305 has first and second data-in-multiplexer data inputs 1306,1307, a data-in-multiplexer control input 1308, and a data-in-multiplexer output 1309. The first data-in-multiplexer data input 1306 receives a test data 1310, and the second data-in-multiplexer data input 1307 receives operational data 380.

When the control circuit 210 instructs the data-in multiplexer 1305 that it is executing the test, the third control-circuit output 343 transmits a command to the data-in-multiplexer control input 1308 to select the first data-in-multiplexer data input 1306 as the active input and to transfer contents of the first data-in-multiplexer data input 1306 to the data-in-multiplexer output 1309. Otherwise, the third control-circuit output 343 transmits a command to the data-in-multiplexer control input 1308 to select the second data-in-multiplexer data input 1307 as the active input and to transfer contents of the second data-in-multiplexer data input 1307, i.e., normal operational data 380, to the data-in-multiplexer output 1309. The data-in-multiplexer control input 1308 is preferably two bits wide to accommodate the required commands.

The input register 381 receives data from the data-in-multiplexer output 1309, and the inverter 1315 receives data from the input register 381.

The input-complement multiplexer 1320 has first and second input-complement-multiplexer data inputs 1321,1322, an input-complement-multiplexer control input 1323, and an input-complement-multiplexer output 1324. The first input-complement-multiplexer data input 1321 receives data from the input register 381, and the second input-complement-multiplexer data input 1322 receives the output of the inverter 1315.

The output-complement multiplexer 1330 has first and second output-complement-multiplexer data inputs 1331, 1332, an output-complement-multiplexer control input 1333, and an output-complement-multiplexer output 1334. The first output-complement-multiplexer data input 1331 receives data from the input register 381, and the second output-complement-multiplexer data input 1332 receives the output of the inverter 1315.

When the control circuit 210 instructs the input-complement multiplexer 1320 that it is to write the test data 1310, the fourth control-circuit output 344 transmits a command to the input-complement-multiplexer control input 1323 to select the first input-complement-multiplexer data input 1321 as the active input and to transfer contents of the first input-complement-multiplexer data input 1321 to the input-complement-multiplexer output 1324. When the control circuit 210 instructs the input-complement multiplexer 1320 that it is to write the inverse test data, the fourth control-circuit output 344 transmits a command to the input-complement-multiplexer control input 1323 to select the second input-complement-multiplexer data input 1322 as the active input and to transfer contents of the second input-complement-multiplexer data input 1322 to the input-complement-multiplexer output 1324.

During normal operation, i.e., not test, the input-complement multiplexer 1320 transfers operational data 380 stored in the input register 381 from first input-complement-multiplexer data input 1321 to the input-complement-multiplexer output 1324.

The output-complement multiplexer 1330 and the exclusive-OR gate 1340 are used to compare the data read from the slice array 118 with the expected value as stored in the input register 381.

The output-complement multiplexer 1330 has first and second output-complement-multiplexer data inputs 1331, 1332, the output-complement-multiplexer control input 1333, and the output-complement-multiplexer output 1334. The first output-complement-multiplexer data input 1331 receives data from the input register 381, and the second output-complement-multiplexer data input 1332 receives the output of the inverter 1315.

When the control circuit 210 instructs the output-complement multiplexer 1330 that it is to select the test data for comparison which is stored in the input register 381, the fifth control-circuit output 345 transmits command to the output-complement-multiplexer control input 1333 to select the first output-complement-multiplexer data input 1331 as the active input and to transfer contents of the input register 381 to the output-complement-multiplexer output 1334, otherwise the fifth control-circuit output 345 transmits command to the output-complement-multiplexer control input 1333 to select the second output-complement-multiplexer data input 1332 as the active input and to transfer contents of the inverter output 1315 to the output-complement-multiplexer output 1334. During normal operation, it is irrelevant whether first output-complement-multiplexer data input 1331 or second output-complement-multiplexer data input 1332 is transferred to the output-complement-multiplexer output 1334. However, in the representative embodiment, the first output-complement-multiplexer data input 1331 is transferred to the output-complement-multiplexer output 1334.

The exclusive-OR gate 1340 has first and second exclusive-OR-gate inputs 1341,1342 and an exclusive-OR-gate output 1343. The first exclusive-OR-gate input 1341 receives data from the output register 383, and the second exclusive-OR-gate input 1342 receives the output-complement-multiplexer output 1334.

The exclusive-OR gate 1340 is used to compare the data read from the slice array 118, which is stored in the output register 383 and presented to the first exclusive-OR-gate input 1341 with the expected value which is stored in the input register 381 and presented to the second exclusive-OR-gate input 1342. When the data in the output register 383 matches that of the expected data the exclusive-OR gate 1340 outputs a binary zero to the exclusive-OR-gate output 1343 indicating a success. Otherwise, the exclusive-OR gate 1340 outputs a binary one to the exclusive-OR-gate output 1343 indicating a failure.

6. Detail of Self Test Circuitry—Error Detection Circuit:

The error detection circuit 230 has a plurality of error detection circuit inputs 231 and a single error detection circuit output 232. The output of each exclusive-OR-gate output 1343 is transferred to its associated error detection circuit input 231. The error detection circuit 230 combines the results of the exclusive-OR gates 1340 for every bit-slice 115 and reports the result to the control circuit 210 via the error detection circuit output 232 to the third control-circuit input 338.

Figure 4:
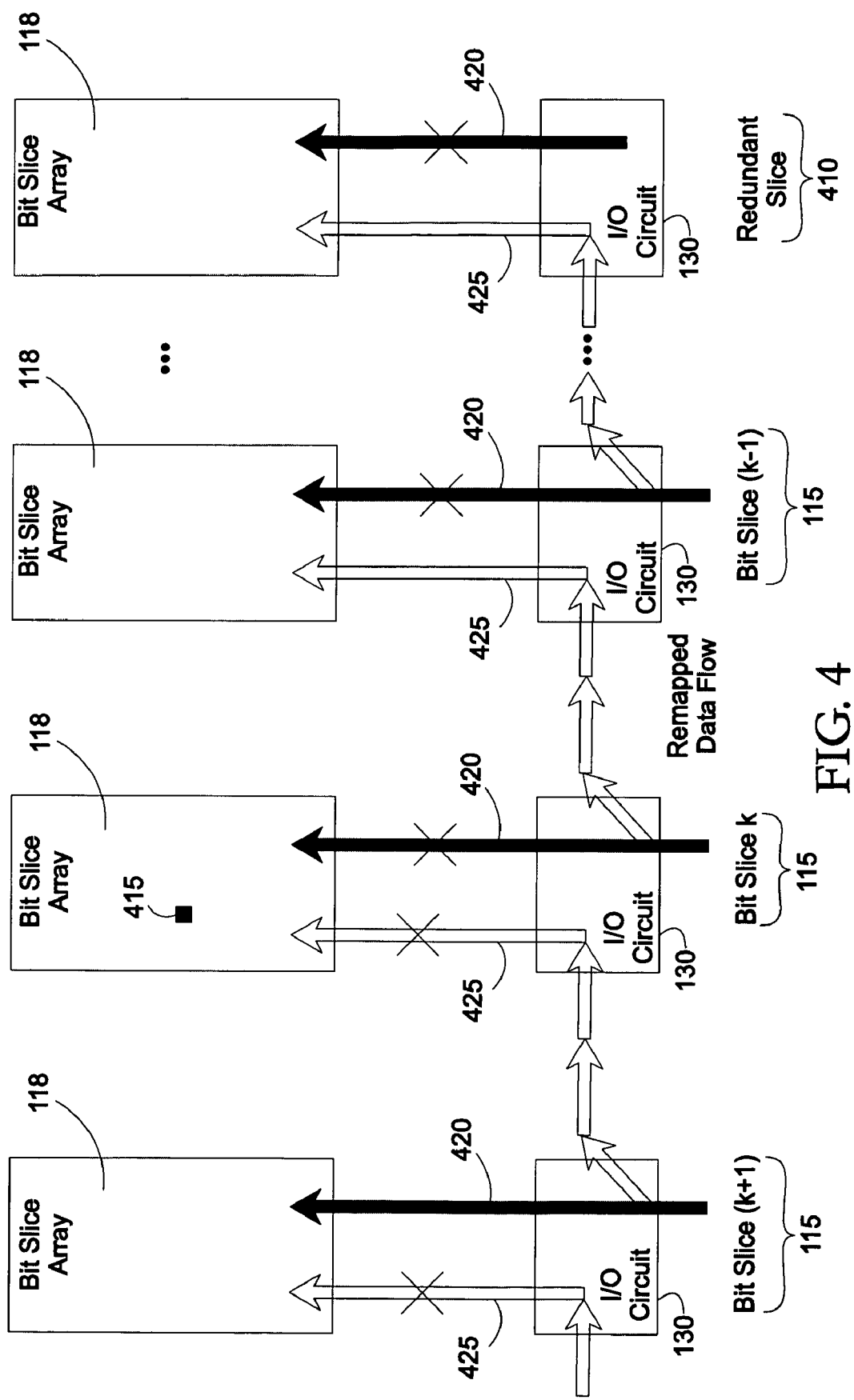
FIG. 4 is a block diagram of circuitry for RAM self-repair as described in various representative embodiments consistent with the teachings of the invention.

7. Redundant RAM Model:

FIG. 4 is a block diagram of circuitry for RAM self-repair as described in various representative embodiments consistent with the teachings of the invention. In FIG. 4, the RAM array 250 is divided into bit-slices 115, each of which includes its associated slice array 118 and I/O circuit 130 as previously stated. The RAM array 250 also comprises a redundant slice 410. Should the RAM array 250 not have any defects, the redundant slice 410 is not used. However, should a defect be encountered, data flow is routed around the bit-slice 115 containing the defect, and the redundant slice 410 is used in its place. The following error types, which are the five most common defect mechanisms, can be corrected using the techniques disclosed herein: (1) single bit, (2) paired bit (two adjacent bits within the same slice), (3) single column, and (4) paired column (two adjacent columns within the same slice), and (5) slice. Essentially any and all defects occurring in the same slice can be repaired as repair occurs via a remapping of slices.

In the example of FIG. 4, the bit-slice 115 corresponding to k-th bit-slice 115 contains a defect 415 which is corrected by rerouting bit-slice I/O for all bit-slices 115 to the right of and including the bit-slice 115 for the k-th bit-slice 115. Each bit-slice comprises two I/O paths, a normal bit-slice I/O path 420 and a alternate bit-slice I/O path 425. Bit-slices 115 to the left of the bit-slice 115 containing the defect 415 utilize their normal bit-slice I/O paths 420 for input/output of those bit-slices 115. The bit-slice 115 containing the defect 415 and all bit-slices 115 to the right of that bit-slice 115 utilize their alternate bit-slice I/O paths 425 for input/output of those bit-slices 115. Thus, all bit-slices 115 to the right of the bit-slice 115 containing the defect 415, as well as the redundant slice 410, are mapped to the I/O circuit 130 to their immediate left.

Figure 5:
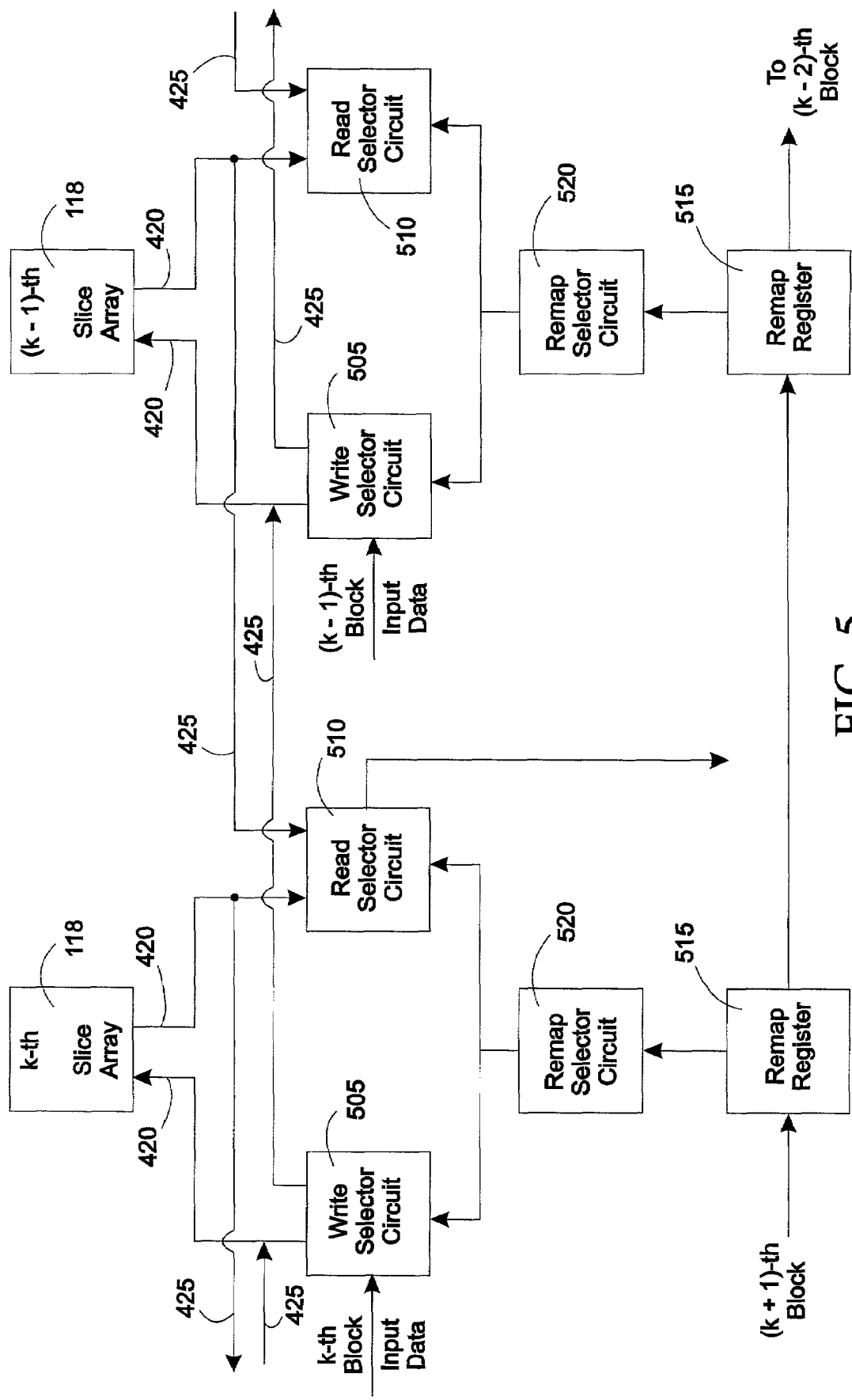
FIG. 5 is another block diagram of circuitry for RAM self-repair as described in various representative embodiments consistent with the teachings of the invention.

8. Overview of Redundant RAM Circuitry:

FIG. 5 is another block diagram of circuitry for RAM self-repair as described in various representative embodiments consistent with the teachings of the invention. As in FIG. 4, it is assumed that a defect occurs in the k-th slice array 118. In such case, a remap register 515 for the k-th bit-slice 115 informs remap selector circuit 520 to redirect data for the k-th bit-slice 115 to the (k-1)-th bit-slice 115 for storage in the (k-1)-th slice array 118. The remap selector circuit 520 in turn instructs a write selector circuit 505 for the k-th bit-slice 115 to write the data for the k-th bit-slice 115 into the (k-1)-th slice array 118.

The remap register 515 for the k-th bit-slice 115 informs remap selector circuit 520 to redirect data read from the (k-1)-th slice array 118 to the k-th bit-slice 115 for transfer out. The remap selector circuit 520 in turn instructs a read selector circuit 510 for the k-th bit-slice 115 to read the data for the k-th bit-slice 115 from the (k−1)-th slice array 118.

Figure 6:
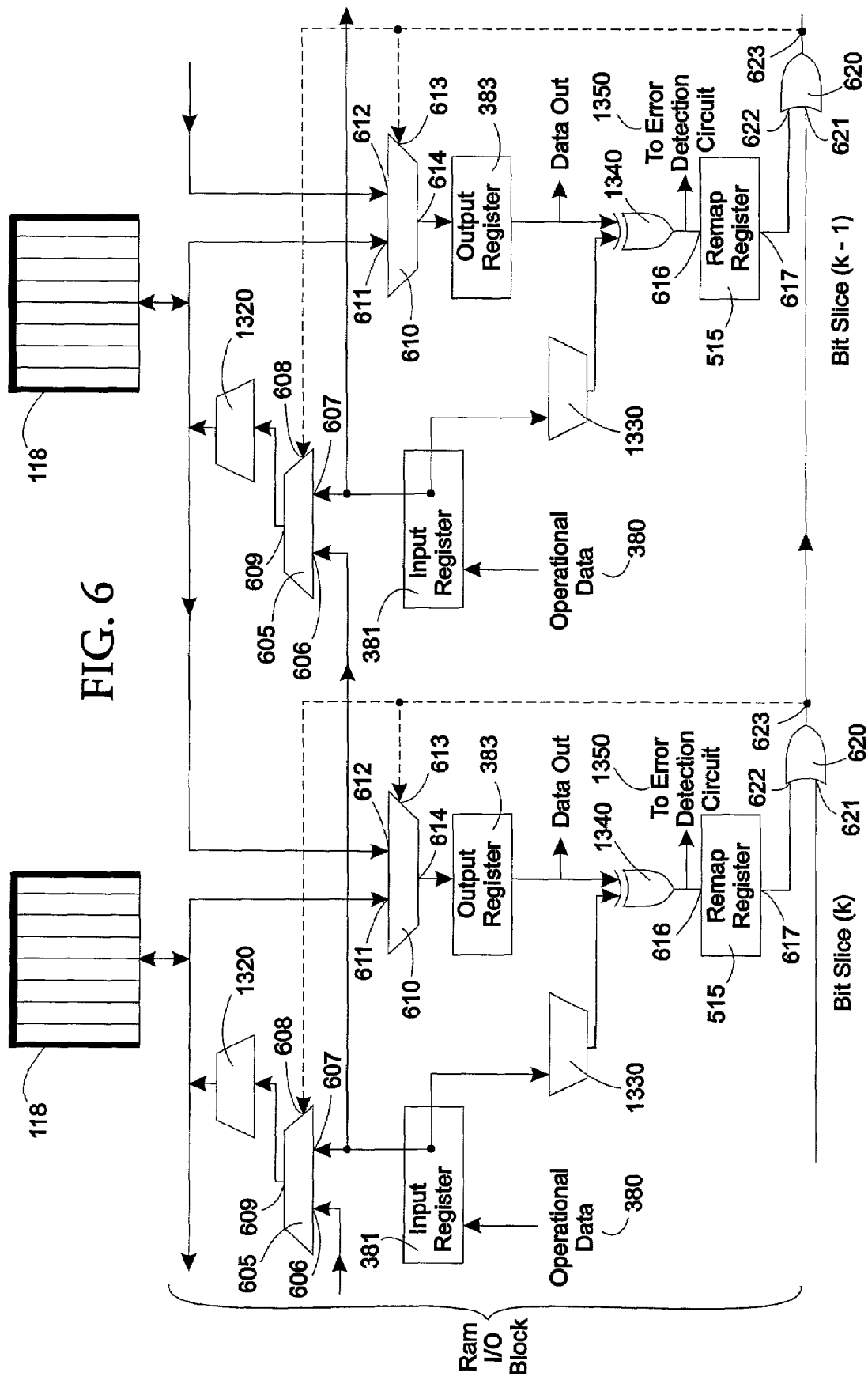
FIG. 6 is yet another block diagram of circuitry for RAM self-repair as described in various representative embodiments consistent with the teachings of the invention.

FIG. 6 is yet another block diagram of circuitry for RAM self-repair as described in various representative embodiments consistent with the teachings of the invention. FIG. 6 shows various circuitry from previous figures. In particular this circuitry includes (1) the input register 381, (2) the input-complement multiplexer 1320, (3) the output-complement multiplexer 1330, (4) the slice array 118, (5) the output register 383, and (6) the exclusive-OR gate 1340.

In addition to the circuitry used for normal RAM read/write functions and defect detection, circuitry necessary for defect repair is as follows: (1) a write multiplexer 605, (2) a read multiplexer 610, (3) the remap register 515, and (4) an OR gate 620. The write multiplexer 605 has first and second write-multiplexer inputs 606,607, a write-multiplexer control input 608, and a write-multiplexer output 609. The read multiplexer 610 has first and second read-multiplexer inputs 611,612, a read-multiplexer control input 613, and a read-multiplexer output 614. The remap register 515 has a remap-register input 616 and a remap-register output 617. The OR gate 620 has first and second OR-gate inputs 621,622 and an OR-gate output 623.

As long as no defects 415 occur to the left of or in bit-slice "k" 115 in FIG. 6, the write multiplexer 605 is enabled so as to write operational data 380 from the input register 381 into its associated bit-slice 115 through input-complement multiplexer 1320. The function of input-complement multiplexer 1320 was explained in the discussion of FIG. 3. Also, the read multiplexer 610 is enabled so as to read data stored in the associate RAM bit-slice 115 into the output register 383 associated with that RAM bit-slice 115. When the output of the OR gate 620, identified as OR-gate output 623, is a binary zero, both inputs to the OR gate 620, identified as first OR-gate input 621 and second OR-gate input 622, are binary zero. The binary zero at the first OR-gate input 621 indicates that no defects were found in any of the bit-slices 115 to the left of the k-th bit-slice 115, and the binary zero at the second OR-gate input 622 indicates that the k-th bit-slice 115 is free of defects 415. The fact that no defects 415 were found in the k-th bit-slice 115 during the test phase is recorded in the remap register 515 by storing a binary zero in it.

If, however, a defect 415 occurs in the k-th bit-slice 115 that fact is recorded in remap register 515. The fact that defect 415 is present in the k-th bit-slice 115 would have been detected during the test phase. In a representative application, the remap register 515 then would have a binary one value stored in it. The OR-gate output 623 then becomes a binary one which switches the k-th write multiplexer 605 to write the value from the (k+1)-th input register 381 into the memory of the k-th bit-slice 115. This action is, however, of no consequence as any data in the k-th bit-slice 115 will be ignored since it is known to have the defect 415. Of more importance is the fact that the read multiplexer control input switches the read multiplexer 610 for the k-th bit-slice 115 to read data from the (k−1)-th bit-slice 115 into the output register 383 for the k-th bit-slice 115 instead of the (k−1)-th bit-slice 115.

Since the OR-gate output 623 for the k-th bit-slice 115 provides the first OR-gate input 621, the OR-gate output 623 for the (k−1)th bit-slice 115 becomes a binary one indicating that the defect 415 occurred in a bit-slice 115 prior to that of the (k−1)th bit-slice 115. This value for the output of the OR gate 620 for the (k−1)th bit-slice 115 switches the write multiplexer 605 for the (k−1)-th bit-slice 115 to write the operational data 380 from the input register 381 of the k-th bit-slice 115 to be written into the memory of the (k−1)-th bit-slice 115.

In a manner similar to that described above, the data stored in the (k−2)th bit-slice 115 will be read out by the read multiplexer 610 of the (k−1)-the bit-slice 115 into the output register 383 of the (k−1)-th bit-slice 115. Thus, all remapping of data for both read and write functions is programmed into the remap registers 515 when the RAM array 250 is tested.

9. Concluding Remarks:

In representative embodiments of the apparatus described in the present patent document, techniques for the on-chip testing of RAM circuits on-chip are disclosed. Present techniques for on-chip testing do not require substantial area on the chip and are inherently located closer to the tested area which reduces propagation delay errors. By locating the circuitry necessary to perform such test in the addressing and input/output blocks of the RAM, these advantages have been obtained.

In other representative embodiments of the apparatus described in the present patent document, techniques for the soft repair of defective RAM circuits are disclosed. Present techniques for repair of RAM circuits do not use techniques such as laser repair in the removal of defective parts of the IC and its replacement with a redundant part. The present process is inexpensive and no additional processing steps are involved. By including the circuitry necessary to repair defects in RAM circuits in the input/output blocks of the RAM, these advantages have been obtained.

While the present invention has been described in detail in relation to representative embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. An electronic circuit for self-test of a random access memory array having a plurality of memory storage cells in a circuit, wherein the storage cells are organized into a plurality of slice arrays, comprising:

a control circuit, wherein the control circuit is embedded in a control and address block of the RAM circuit;

an address selection circuit, wherein the control circuit directs the address selection circuit to index through memory addresses;

one input/output circuit each associated with each slice array, wherein the control circuit directs each input/output circuit to write data into its associated slice array at an indexed memory address, to read data from the associated slice array at the indexed memory address, and to compare the data read from the associated slice array with that written into the associated slice array at the indexed memory address; and an error detection circuit, wherein the error detection circuit collects results of self-test data comparisons from each input/output circuit and notifies the control circuit of the results of the data comparisons, wherein:

when a defect is present in one of the slice arrays, the input/output circuit associated with the defective slice array redirects data intended for storage in the defective slice array to an adjacent slice array, and wherein:

when a defect is present in one of the slice arrays, the input/output circuit associated with the defective slice array redirects data read from the adjacent slice array of the defective slice array to the output of the defective slice array.

2. The electronic circuit as recited in claim 1, wherein the electronic circuit is embedded within the RAM circuit in an integrated circuit.

3. The electronic circuit as recited in claim 1, wherein the address selection circuit is embedded in the control and address block of the RAM circuit.

4. The electronic circuit as recited in claim 1, wherein the control circuit initiates and terminates the self-test at preselected conditions, wherein the address selection circuit, informs the control circuit when the indexed memory address equals an initial self-test memory address, and wherein the address selection circuit, informs the control circuit when the indexed memory address equals a final self-test memory address.

5. The electronic circuit as recited in claim 1, wherein when a defect is present in one of the slice arrays, the input/output circuit associated with each subsequent slice array of the defective slice array redirects data intended for storage in that subsequent slice array to the adjacent slice array of that subsequent slice array and the input/output circuit associated with each previous slice array of the defective slice array directs data intended for storage in that previous slice array to that previous slice array and wherein when a defect is present in one of the slice arrays, the input/output circuit associated with each subsequent slice array of the defective slice array redirects data read from the adjacent slice array of that subsequent slice array to the output of that subsequent slice array and the input/output circuit associated with each previous slice array of the defective slice array directs data read from that previous slice array to the output of that previous slice array.

6. An electronic circuit for self-test of a random access memory array having a plurality of memory storage cells in a RAM circuit, wherein the storage cells are organized into a plurality of slice arrays, comprising:
   a control circuit, wherein the control circuit is embedded in a control and address block of the RAM circuit;
   an address selection circuit, wherein the control circuit directs the address selection circuit to index through memory addresses;
   one input/output circuit each associated with each slice array, wherein the control circuit directs each input/output circuit to write data into its associated slice array at an indexed memory address, to read data from the associated slice array at the indexed memory address, and to compare the data read from the associated slice array with that written into the associated slice array at the indexed memory address; and
   an error detection circuit, wherein the error detection circuit collects results of self-test data comparisons from each input/output circuit and notifies the control circuit of the results of the self-test data comparisons and wherein the address selection circuit comprises:
      an address multiplexer, wherein the address multiplexer has first, second, and third address-multiplexer inputs and an address-multiplexer output, wherein the second address-multiplexer input receives the memory address at which the self-test is initiated, wherein the third address-multiplexer input is configured to receive normal operational data addresses, and wherein when the address multiplexer receives command from the control circuit to initiate the self-test, the value of the second address-multiplexer input is transferred to the address-multiplexer output;
      a register, wherein the address-multiplexer output is connected to the input of the register and wherein the content of the register is used to address the RAM memory in writing and reading self-test data;
      a sequencer, wherein the output of the register is connected to the input of the sequencer, wherein the sequencer outputs an indexed version of the address received at the input of the sequencer, and wherein the output of the sequencer is connected to the first address-multiplexer input; and
      a comparator, wherein the output of the register is connected to the input of the comparator, wherein the comparator has first and second comparator outputs, wherein comparator first and second outputs are connected to the control circuit, wherein the first comparator output indicates when the register contains an initial self-test memory address, and wherein the second comparator output indicates when the register contains a final self-test memory address.

7. The electronic circuit as recited in claim 6, wherein the address multiplexer, the register, the sequencer, and the comparator are embedded in a control and address block of the RAM circuit.

8. The electronic circuit as recited in claim 6, wherein the electronic circuit is embedded within the RAM circuit in an integrated circuit.

9. The electronic circuit as recited in claim 6, wherein the address selection circuit is embedded in the control and address block of the RAM circuit.

10. The electronic circuit as recited in claim 6, wherein the control circuit initiates and terminates the self-test at preselected conditions, wherein the address selection circuit, informs the control circuit when the indexed memory address equals an initial self-test memory address, and wherein the address selection circuit, informs the control circuit when the indexed memory address equals a final self-test memory address.

11. An electronic circuit for self-test of a random access memory array having a plurality of memory storage cells in a RAM circuit, wherein the storage cells are organized into a plurality of slice arrays, comprising:
   a control circuit, wherein the control circuit is embedded in a control and address block of the RAM circuit;
   an address selection circuit, wherein the control circuit directs the address selection circuit to index through memory addresses:
   one input/output circuit each associated with each slice array, wherein the control circuit directs each input/output circuit to write data into its associated slice array at an indexed memory address, to read data from the associated slice array at the indexed memory address, and to compare the data read from the associated slice array with that written into the associated slice array at the indexed memory address; and
   an error detection circuit, wherein the error detection circuit collects results of self-test data comparisons from each input/output circuit and notifies the control circuit of the results of the self-test data comparisons and wherein the input/output circuit comprises:
      a data-in multiplexer, wherein the data-in multiplexer has first and second data-in-multiplexer inputs and a data-in-multiplexer output, wherein the first data-in-multiplexer input is configured to receive the self-test data, wherein the second data-in-multiplexer input is configured to receive normal operational data, and wherein:

when the data-in multiplexer receives command from the control circuit to perform the self-test, the value of the first data-in-multiplexer input is transferred to the data-in-multiplexer output, otherwise, the second data-in-multiplexer input is configured to transfer its value to the data-in-multiplexer output;

an input register, wherein the output of the data-in-multiplexer output is connected to the input of the input register;

an inverter, wherein the output of the input register is connected to the input of the inverter;

an input-complement multiplexer, wherein the input-complement multiplexer has first and second input-complement-multiplexer inputs and an input-complement-multiplexer output, wherein the output of the input register is connected to the first input-complement-multiplexer input, wherein the output of the inverter is connected to the second input-complement-multiplexer input, and wherein:

when, the control circuit instructs the input-complement multiplexer to write test data into the slice array, the value of the first input-complement-multiplexer input is transferred to the input-complement-multiplexer output, otherwise, the value of the second input-complement-multiplexer input is transferred to the input-complement-multiplexer output;

an 'output-complement multiplexer, wherein the output-complement multiplexer has first and second output-complement-multiplexer inputs and an output-complement-multiplexer output, wherein the output of the input register is connected to the first output-complement-multiplexer input, wherein the output of the inverter is connected to the second output-complement-multiplexer input, and wherein:

when the control circuit instructs the output-complement multiplexer to compare test data to data in the slice array, the value of the first output-complement-multiplexer input is transferred to the output-complement-multiplexer output, otherwise, the value of the second output-complement-multiplexer input is transferred to the output-complement-multiplexer output;

an output register, wherein the output register receives the contents of the slice array; and an exclusive-OR gate, wherein the exclusive-OR gate has first and second exclusive-OR-gate inputs and an exclusive-OR-gate output, wherein the output of the output register is connected to the first exclusive-OR-gate input, and wherein the output-complement-multiplexer output is connected to the second exclusive-OR-gate input.

12. The electronic circuit as recited in claim 11, wherein the input to the error detection circuit is connected to the exclusive-OR-gate output.

13. The electronic circuit as recited in claim 11, wherein the electronic circuit is embedded within the RAM circuit in an integrated circuit.

14. The electronic circuit as recited in claim 11, wherein the address selection circuit is embedded in the control and address block of the RAM circuit.

15. The electronic circuit as recited in claim 11, wherein the control circuit initiates and terminates the self-test at preselected conditions, wherein the address selection circuit, informs the control circuit when the indexed memory address equals an initial self-test memory address, and wherein the address selection circuit, informs the control circuit when the indexed memory address equals a final self-test memory address.

* * * * *